(12) United States Patent
Okada et al.

(10) Patent No.: US 7,189,917 B2
(45) Date of Patent: Mar. 13, 2007

(54) STACKED PHOTOVOLTAIC DEVICE (75) Inventors: Naoto Okada, Nara (JP); Toshimitsu Kariya, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 293 days.

(21) Appl. No.: 10/801,681

(22) Filed: Mar. 17, 2004

(65) Prior Publication Data
US 2004/0187913 A1   Sep. 30, 2004

(30) Foreign Application Priority Data
Mar. 26, 2003   (JP) ............................ 2003-084782

(51) Int. Cl.
H01L 31/00   (2006.01)

(52) U.S. Cl. ...................... 136/255; 136/246; 136/258; 136/261

(58) Field of Classification Search ................ 136/249, 136/255, 258, 261, 246, 259; 257/461, 458, 257/431, 436
See application file for complete search history.

(56) References Cited

U.S. PATENT DOCUMENTS

| | | | | |
|---|---|---|---|---|
| 4,536,607 A * | 8/1985 | Wiesmann | .................. | 136/249 |
| 4,971,919 A * | 11/1990 | Yamazaki | .................... | 438/74 |
| 5,021,100 A | 6/1991 | Ishihara et al. | ............. | 136/249 |
| 5,510,151 A | 4/1996 | Matsuyama et al. | ........ | 427/509 |
| 5,714,010 A | 2/1998 | Matsuyama et al. | ........ | 118/723 |
| 6,123,824 A | 9/2000 | Sano et al. | ................. | 205/124 |
| 6,127,202 A * | 10/2000 | Kapur et al. | ................... | 438/47 |
| 6,153,823 A | 11/2000 | Shiozuki et al. | ............ | 136/249 |
| 6,177,711 B1 | 1/2001 | Kariya | ........................ | 257/458 |
| 6,215,061 B1 | 4/2001 | Kariya | ........................ | 136/256 |
| 6,261,862 B1 | 7/2001 | Hori et al. | ..................... | 438/96 |
| 6,344,608 B2 | 2/2002 | Kariya et al. | ............... | 136/257 |
| 6,472,248 B2 | 10/2002 | Shiozaki et al. | .............. | 438/97 |
| 6,482,668 B2 | 11/2002 | Okada et al. | ................. | 438/62 |
| 6,960,718 B2 * | 11/2005 | Sano et al. | .................. | 136/255 |
| 2002/0157703 A1 | 10/2002 | Nakayama et al. | ......... | 136/256 |
| 2003/0049881 A1 | 3/2003 | Takada et al. | ................ | 438/62 |
| 2003/0217769 A1 * | 11/2003 | Okada | ........................ | 136/255 |

FOREIGN PATENT DOCUMENTS

| | | | |
|---|---|---|---|
| JP | 63-77167 A | * | 4/1966 |
| JP | 61-1062 A | * | 1/1986 |
| JP | 63-77167 | | 4/1988 |
| JP | 2-237172 | | 9/1990 |
| JP | 9-220786 A | * | 8/1997 |

OTHER PUBLICATIONS

Kenji Yamamoto, "Thin film polycrystalline silicon solar cell," Japanese Society of Applied Physics, Fifth Edition, vol. 71, May 2002, pp. 524-527. (with partial English-language translation).

* cited by examiner

Primary Examiner—Nam Nguyen
Assistant Examiner—Jeffrey Barton
(74) Attorney, Agent, or Firm—Fitzpatrick, Cella, Harper & Scinto (57) ABSTRACT

To provide a stacked photovoltaic device including: at least one pair of a first photovoltaic device and a second photovoltaic device stacked in order from a light incident side; and a selective reflection layer formed between the at least one pair of the first photovoltaic device and the second photovoltaic device and adapted to electrically connect therebetween, in which the selective reflection layer has a sheet resistance of 100 k$\Omega$/□ or more and 100 M$\Omega$/□ or less.

8 Claims, 5 Drawing Sheets

PRIOR ART

FIG. 9

STACKED PHOTOVOLTAIC DEVICE

BACKGROUND OF THE INVENTION

1. Field of the Invention

The present invention relates to a stacked photovoltaic device having at least two power generating function units.

2. Related Background Art

Photovoltaic devices are devices for converting an incident light energy to an electric energy. Among those, a solar cell is a photovoltaic device for converting sunlight as white light to an electric energy, which enables efficient conversion of light of a wide wavelength region. Therefore, in order to achieve a high conversion efficiency, it is necessary to perform efficient light absorption throughout a wide wavelength region.

As a measure therefor, there is well known a stacked photovoltaic device formed by stacking photovoltaic devices having semiconductor layers of different band gaps as photoactive layers. The stacked photovoltaic device efficiently absorbs and utilizes light in a wide wavelength region by disposing a photovoltaic device using a semiconductor of a relatively large band gap at a light incident side to absorb short-wavelength light having a large energy and disposing a photovoltaic device using a semiconductor of a relatively small band gap under the light incident side device to absorb long-wavelength light having a small energy that has passed through the upper device.

Here, it is necessary to introduce into each photovoltaic device light of a wavelength region suitable for that device. This is because the wavelength region of an incident light that can be utilized by each photovoltaic device is limited by the band gap of a semiconductor used for a photoactive layer of that photovoltaic device. That is, a photon having an energy smaller than a band gap energy is not absorbed by a semiconductor and can not be utilized. Further, although a photon having an energy greater than a band gap energy is absorbed by a semiconductor, the potential energy of an electron which can be provided when exciting the electron is limited to the magnitude of the band gap. Therefore, it is impossible to use a difference component between the band gap energy and the photon energy. That is, in the case of the stacked photovoltaic device, it is important to make only light of a short-wavelength region incident on the light incident side device of a stacked photovoltaic device and to make only light in a long-wavelength region incident on the underlying device.

As a measure therefor, there is known a method of providing a transparent conductive film between upper and lower photovoltaic devices and using the film as a selective reflection layer. For example, Japanese Patent Application Laid-Open No. S63-77167 or "Thin film polycrystalline silicon solar cell" by Kenji Yamamoto, Applied Physics, Japan Society of Applied Physics, Fifth Edition, Volume 71 (May, 2002), pp.524–527 disclose a method of providing a conductive layer as a selective reflection layer for reflecting short-wavelength light and passing long-wavelength light therethrough between photovoltaic devices. Further, Japanese Patent Application Laid-Open No. H02-237172 discloses a method of adjusting the film thickness of the selective reflection layer to conform the peak of the reflectivity of the layer to a maximum wavelength of the spectral sensitivity of a light incident side photovoltaic device, thereby increasing the current value of the light incident side photovoltaic device. Those methods aim at preventing short-wavelength light to be originally absorbed by a light incident side photovoltaic device from being absorbed by an underlying photovoltaic device to thereby improve the conversion efficiency of the light incident side photovoltaic device.

Incidentally, the selective reflection layer needs to have a function of light reflection as well as a function of establishing an electrical connection between plural devices. At this time, the selective reflection layer functions as an external resistor from the viewpoint of an electric circuit. Thus, a large resistance value thereof directly results in a deteriorated fill factor of the device. For that reason, a material having a high conductivity has been hitherto used for the selective reflection layer.

On the other hand, a large-area photovoltaic device such as a solar cell reduces, because of the large area, its conversion efficiency owing to a short-circuit current generated at electrically defective portions of the device resulting from dust or other such foreign matters during film formation. To cope with the reduction is now a big concern. An effective countermeasure against the reduction is, as well known in the art, shunt passivation for immersing the device in an electrolyte, causing a current to flow through the electrolyte, and selectively dissolving a transparent electrode at an electrically defective portion for the removal. This technique realizes the selective removal of the transparent electrode by making use of the fact that the electrically defective portion more easily allows the current to flow therethrough than a normal portion of the device does, and suppresses the generation of the short-circuit current by isolating the electrically defective portion in terms of the electric circuit.

In the conventional photovoltaic device using the selective reflection layer, the selective reflection layer is not an exposed surface layer and thus makes it difficult to exclude the electrically defective portion from the electric circuit through the shunt passivation.

Figure 8:
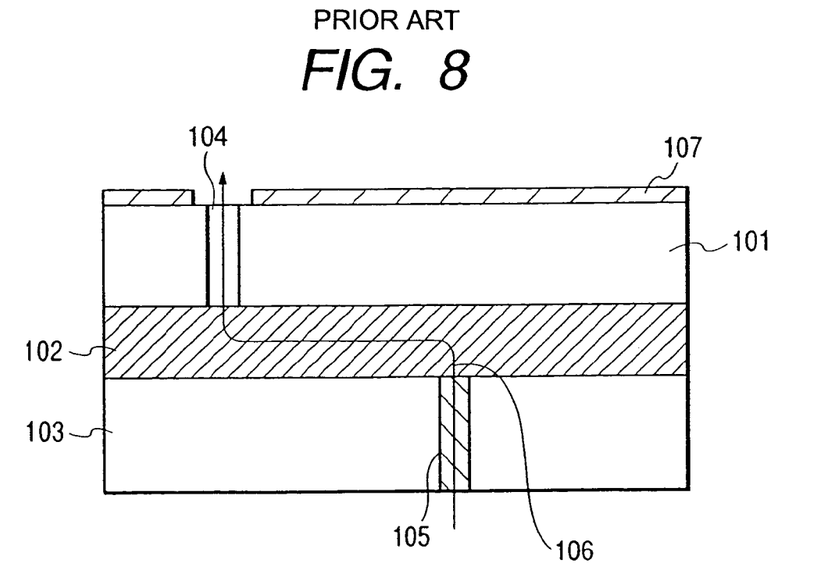
FIG. 8 is a schematic diagram showing a process of shunt passivation of a conventional stacked photovoltaic device having a selective reflection layer.

More specifically, as shown in FIG. 8, in a shunt passivation process of the photovoltaic device using the selective reflection layer, a conduction path is formed in a planer form in a selective reflection layer 102 having a low resistance between a first photovoltaic device 101 and a second photovoltaic device 103. Thus, in an electrically defective portion 105 of the second photovoltaic device 103, concentration of a passivation current 106 does not occur and a transparent electrode 107 is only removed at an electrically defective portion 104 in the first photovoltaic device 101.

Figure 9:
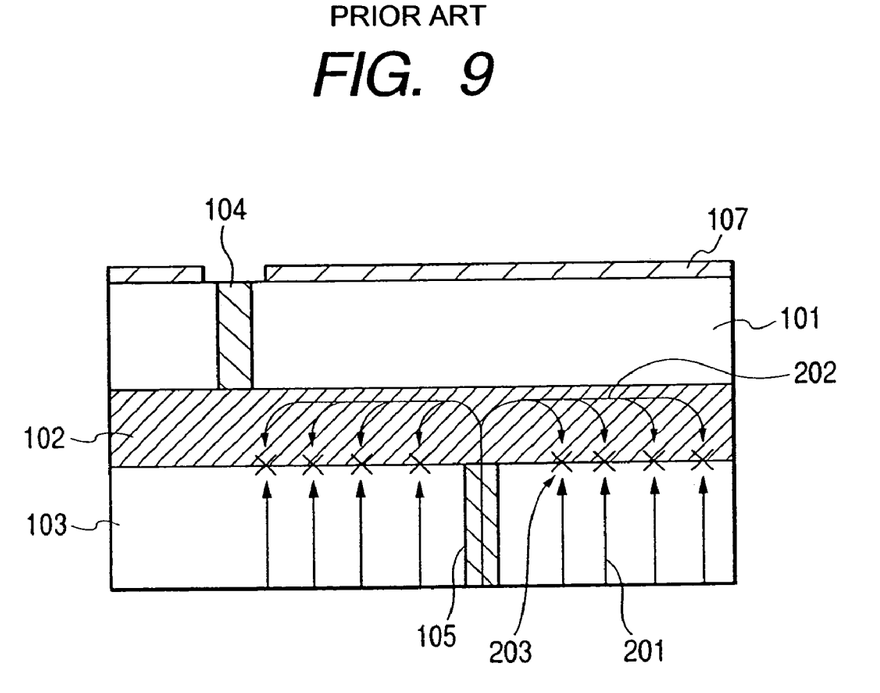
FIG. 9 is a schematic diagram illustrative of power generation of the conventional stacked photovoltaic device having the selective reflection layer.

Further, as shown in FIG. 9, if power generation starts in this state, a short-circuit current 202 flowing through the electrically defective portion 105 is spread in a planer form since a conductive film of the electrically defective portion 105 in the second photovoltaic device 103 is not removed. As a result, carriers disappear at a junction surface 203 between a photocurrent 201 of the second photovoltaic device 103 and the short-circuit current 202, leading to diminished electromotive force.

Further, in the case where the transparent electrode 107 at the electrically defective portion 104 in the first photovoltaic device 101 is not fully removed in the shunt passivation process, the short-circuit current is also spread in a planer form in the first photovoltaic device 101 as mentioned above, which further diminishes the electromotive force.

In particular, the conventional selective reflection layer 102 is made of a material having a high conductivity and shows a lower sheet resistance. As a result, the short-circuit current is too widely spread in a planer form, causing a drop of the conversion efficiency of the whole device.

As mentioned above, up to now, even though the selective reflection layer is incorporated for increasing the photocurrent, the photovoltaic device having less electromotive force can only be produced.

SUMMARY OF THE INVENTION

The present invention has been made in view of the aforementioned problems and accordingly has an object to provide a stacked photovoltaic device capable of generating a large amount of photocurrent without involving reduction of an electromotive force and thus capable of attaining a high conversion efficiency.

In order to attain the above-mentioned object, a stacked photovoltaic device according to the present invention includes: at least one pair of a first photovoltaic device and a second photovoltaic device stacked in order from a light incident side; and a selective reflection layer formed between the at least one pair of the first photovoltaic device and the second photovoltaic device and adapted to electrically connect therebetween, and in the stacked photovoltaic device, the selective reflection layer has a sheet resistance of 100 k$\Omega$/□ or more and 100 M$\Omega$/□ or less.

In the stacked photovoltaic device according to the present invention, it is preferable that the selective reflection layer has a sheet resistance of 100 k$\Omega$/□ or more and 50 M$\Omega$/□ or less.

In the stacked photovoltaic device according to the present invention, it is preferable that the selective reflection layer has a sheet resistance of 5 M$\Omega$/□ or more and 50 M$\Omega$/□ or less.

Further, it is preferable that the selective reflection layer has a conductivity in a thickness direction of a film which is larger than a conductivity in an in-plane direction of the film.

Further, it is preferable that the selective reflection layer includes a deposited film formed of metal oxide.

Further, it is preferable that the first photovoltaic device has at least a pin-type junction and an i-type layer thereof is made of amorphous Si:H.

Further, it is preferable that the second photovoltaic device has at least a pin-type junction and an i-type layer thereof is made of Si having crystallinity.

Alternatively, it is preferable that the second photovoltaic device has at least a pn-type junction and a p-type semiconductor and an n-type semiconductor are made of one of monocrystalline Si, polycrystalline Si, and Si having crystallinity.

According to the present invention, significant effects can be exerted in that the selective reflection layer can be incorporated in the device without causing reduction in an electromotive force due to an electrically defective portion, a large amount of photocurrent can be attained by virtue of efficient light absorption throughout wavelength regions of incident light, and a stacked photovoltaic device capable of achieving a high conversion efficiency can be therefore provided.

DESCRIPTION OF THE PREFERRED EMBODIMENTS

Hereinafter, an embodiment of the present invention will be described with reference to the accompanying drawings. However, the present invention is not limited to this embodiment.

Figure 1:
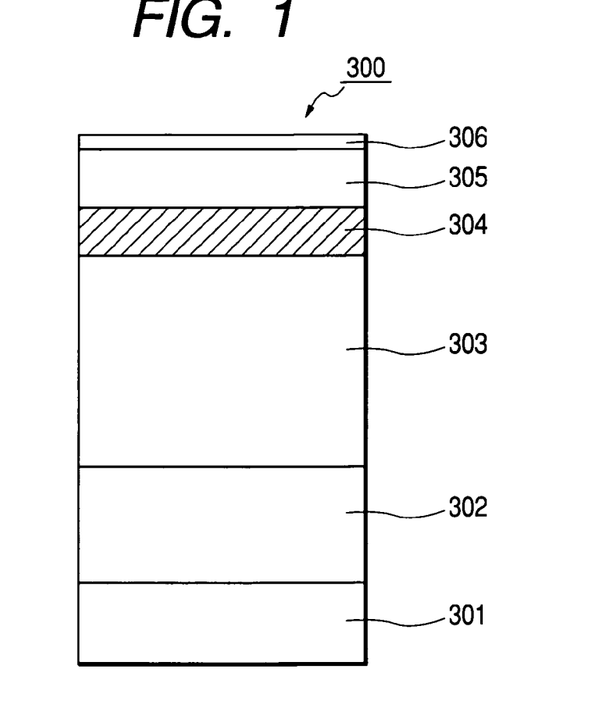
FIG. 1 is a diagram schematically showing a cross-sectional structure of a stacked photovoltaic device according to an embodiment of the present invention.

FIG. 1 is a diagram schematically showing a cross-sectional structure of a stacked photovoltaic device according to an embodiment of the present invention. As illustrated in FIG. 1, a stacked photovoltaic device 300 is composed by stacking on a conductive substrate 301 made of metal etc., a light reflection layer 302, a second photovoltaic device 303, a selective reflection layer 304, a first photovoltaic device 305, and a transparent electrode 306 in the stated order. A semiconductor composing a photoactive portion of the first photovoltaic device 305 has a larger band gap than a semiconductor composing a photoactive portion of the second photovoltaic device 303. The device is designed such that the first photovoltaic device 305 absorbs the light in a short wavelength region, whereas the second photovoltaic device 303 absorbs the light in a long wavelength region. The selective reflection layer 304 exhibits a high reflectivity to the light in the short wavelength region and thus exerts an effect of increasing a light absorption amount of the first photovoltaic device 305.

Next, components of the stacked photovoltaic device 300 of the present invention will be described in detail below.

(Substrate)

As the substrate 301 for use in the stacked photovoltaic device 300 of the present invention, it is suitable to use a conductive substrate such as a metal plate, for example, a stainless steel plate or an insulating substrate which is made conductive by depositing metal or the like. Ferrite-based stainless steel is preferably used for the metal substrate, and glass, ceramics, or polyimide is preferably used for the insulating substrate. Further, when light is made incident from the substrate side, a light transmissive insulating substrate is used, and glass is particularly preferably used therefor.

(Reflection Layer)

As the light reflection layer 302 for the stacked photovoltaic device 300 of the present invention, a deposited film of a metal such as Al, Ag, Au, or Cu, or an alloy thereof is used. Further, the surface of the light reflection layer 302 is preferably uneven so as to cause irregular reflections. The range of the thickness of the light reflection layer 302 preferably is 10 nm to several μm. Further, a reflection increasing layer for the light reflection layer 302 is preferably provided in order to increase the quantity of reflected light.

A metal oxide such as indium oxide, tin oxide, or zinc oxide (ZnO) is suitable for the material for the reflection increasing layer, of which zinc oxide (ZnO) is particularly preferably used. The range of the thickness of the reflection increasing layer is preferably 100 nm to 5000 nm.

(Second Photovoltaic Device)

Examples of the junction of the second photovoltaic device 303 used for the stacked photovoltaic device 300 of the present invention include a pn junction, a pin junction, an MIS junction, or the like. Further, the semiconductor used for the photoactive layer includes a monocrystalline, polycrystalline, microcrystalline, or amorphous material of Group IV, III-V, II-VI or I-III-VI$_2$. The Group IV material includes Si, Ge, and an alloy thereof, the Group III-V material includes GaAs, GaSb, InP, and InAs, the Group II-VI material includes CdTe and Cu$_2$S and the Group I-III-VI$_2$ material includes CuInSe$_2$ and so on. In Particular, a pn-type monocrystalline Si, or a pin-type amorphous SiGe:H is preferably used and a pin-type microcrystalline Si is more preferably used. Further, in the case of the non-monocrystalline material, it is desirable that the p-layer and n-layer are microcrystalline.

(Selective Reflection Layer)

As the selective reflection layer 304 for the stacked photovoltaic device 300 of the present invention, a metal oxide film of indium oxide, tin oxide, indium-tin oxide, zinc oxide (ZnO), or the like is preferably used. Of those, zinc oxide (ZnO) is particularly preferably used.

The reflectivity of the selective reflection layer 304 varies depending on the wavelength region for efficient energy conversion of incident light in every wavelength region. To be specific, the reflectivity is high in a short wavelength region and low in a long wavelength region on the basis of a wavelength λm at which the second photovoltaic device 303 shows the highest spectroscopic characteristics. The film for the selective reflection layer desirably has a transmittance of 80% or more so as to prevent losses of incident light.

Further, the sheet resistance of the selective reflection layer 304 of the present invention is adjusted to a sheet resistance value of 100 kΩ/□ or more and 100 MΩ/□ or less for avoiding reduction in electromotive force of the device due to the electrically defective portion. Here, the sheet resistance "Ω/□" is defined as a resistivity (resistance value) between two electrodes (1 cm each) provided face to face on opposite sides of a 1 cm-square film with a distance of 1 cm therebetween. The sheet resistance value of the selective reflection layer 304 is more preferably 5 MΩ/□ or more and 50 MΩ/□ or less.

The transparent conductive film constituting the selective reflection layer 304 desirably exhibits a larger conductivity in a direction perpendicular to the film than a conductivity in an in-plane direction of the film.

Also, a thickness of the selective reflection layer 304 is preferably 0.2 to 10 μm, more preferably 0.8 to 5 μm for improving surface texture.

In addition, the selective reflection layer 304 desirably has a lower index of refraction than that of a portion where the first photovoltaic device 305 is in contact with the selective reflection layer for the purpose of increasing the reflectivity of an interface therebetween.

(First Photovoltaic Device)

Examples of the junction of the first photovoltaic device 305 used for the stacked photovoltaic device 300 of the present invention include a pn junction, a pin junction, an MIS junction, or the like. Further, the semiconductor used for the photoactive layer includes a monocrystalline, polycrystalline, microcrystalline, or amorphous material of Group IV, III-V, or II-VI. The Group IV material includes Si, Ge, C, and an alloy thereof, the Group III-V material includes AlAs, AlSb, GaN, GaP, GaAs, and InP, the Group II-VI material includes ZnSe, ZnS, ZnTe, CdS, CdSe, and so on. Preferably, pin-type amorphous Si:H is used. Further, it is desirable that the p-layer and n-layer are microcrystalline.

(Transparent Electrode)

The material of the transparent electrode 306 used for the stacked photovoltaic device 300 of the present invention includes indium oxide, tin oxide, or indium-tin oxide, and the transparent electrode is formed by a sputtering method, vacuum evaporation method, chemical vapor deposition method, ion plating method, ion beam method, ion beam sputtering method, or the like. Further, it is possible to form the transparent electrode also by electrodeposition or dipping using an aqueous solution containing nitrate, acetate, or ammonium groups with metal ions.

Also, two unit devices (first photovoltaic device and second photovoltaic device) in the stacked photovoltaic device according to the present invention are not exclusively adopted. The present invention is effective for a triple, quad, or higher-order multiple stacked structure and also for a structure where the selective reflection layers are interposed between the unit devices.

Figure 2:
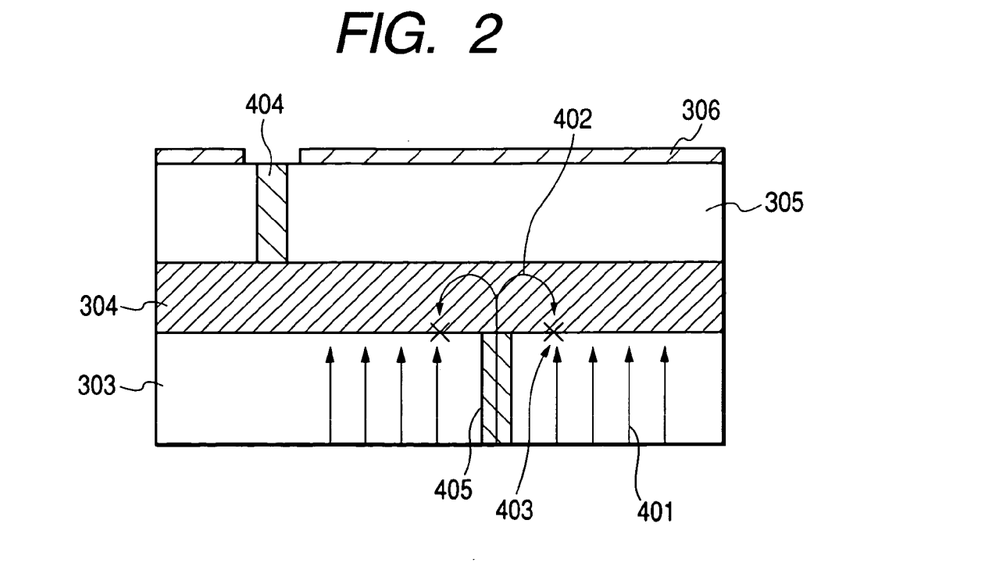
FIG. 2 is a schematic diagram illustrative of power generation of the stacked photovoltaic device according to the present invention.

FIG. 2 is a schematic diagram illustrative of power generation of the stacked photovoltaic device according to the present invention. In FIG. 2, reference numeral 303 denotes the second photovoltaic device; 304, the selective reflection layer; 305, the first photovoltaic device; 306, the transparent electrode; 401, a photocurrent; 402, a short-circuit current; 403, a junction surface; and 404 and 405, electrically defective portions. The electrically defective portion 404 in the first photovoltaic device 305 functions as a short-circuit path of the current. However, in the stacked photovoltaic device of the present invention, the transparent electrode on the electrically defective portion 404 is removed through passivation treatment. As a result, the electrically defective portion 404 is substantially excluded from the electric circuit composed of the photovoltaic devices and a load upon the power generation. Therefore, the conversion efficiency of the first photovoltaic device 305 does not drop. Next, a conductive film constituting the selective reflection layer 304 is formed around the electrically defective portion 405 in the second photovoltaic device 303. However, the selective reflection layer 304 of the present invention has a high sheet resistance value, by which the short-circuit current 402 flowing through the electrically defective portion 405 is hardly spread two-dimensionally. Accordingly, the short-circuit current 402 gives rise to the electromotive force reduction solely in a minimum region around the electrically defective portion 405. Thus, the whole device causes substantially no reduction in electromotive force.

In addition, even when the passivation treatment is not sufficiently conducted on the transparent electrode on the electrically defective portion in the first photovoltaic device, the selective reflection layer does not form a conduction path for the short-circuit current therein, so that a large-area closed circuit including the first photovoltaic device 305 is not formed. Thus, there is little adverse effect on the characteristics thereof.

As mentioned above, according to the stacked photovoltaic device of the present invention, it is possible to incorporate the selective reflection layer without causing the reduction in electromotive force due to the electrically defective portion and to realize the high-efficiency photovoltaic device.

Preferred examples of the present invention are described below in detail by referring to the accompanying drawings. However, the present invention is no way limited to the examples.

EXAMPLE

A stacked photovoltaic device of this example shown in FIG. 1 was prepared using a pin-type photovoltaic device whose i-layer is intrinsic amorphous Si:H as a first photovoltaic device, a pin-type photovoltaic device whose i-layer is intrinsic microcrystalline Si as a second photovoltaic device, and zinc oxide (ZnO) as a selective reflection layer.

(Reflection Layer)

As a substrate 301, a stainless steel sheet (SUS430) subjected to the so-called No. 2D finishing of 45 mm square and 0.15 mm in thickness was used and set in a commercially available DC magnetron sputtering system (not shown) to be exhausted until the inner pressure became $10^{-3}$ Pa or less. Thereafter, an argon gas was supplied into the system at 30 sccm (here, sccm represents a unit of flow rate and 1 sccm=1 cm$^3$/min (standard conditions)) and the inner pressure was kept at $2 \times 10^{-1}$ Pa. The substrate was not heated and a DC power of 120 W was applied to an aluminum target of 6 inches Φ to form an aluminum thin film of a thickness of 70 nm for 90 seconds.

Figure 3:
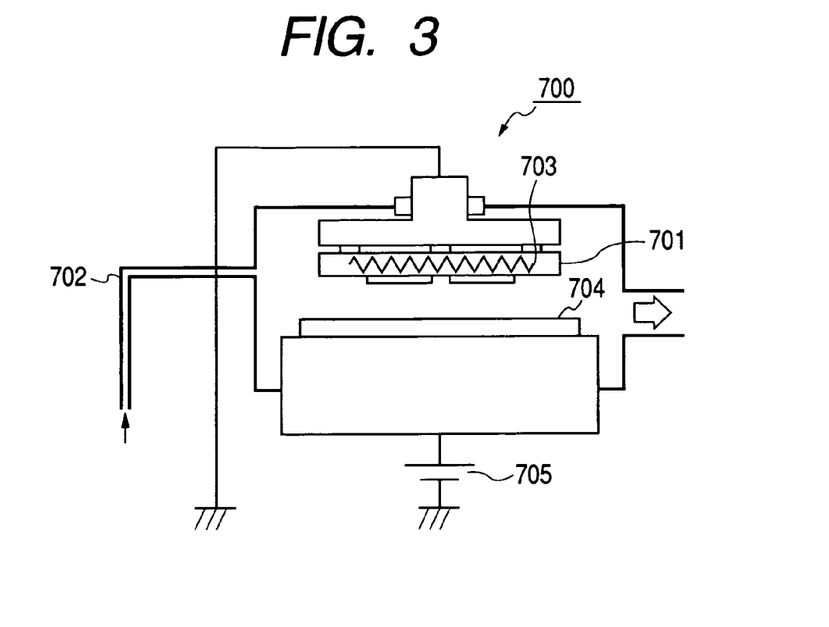
FIG. 3 is a schematic diagram showing an example of an apparatus suitable for forming a reflection layer and a selective reflection layer of the stacked photovoltaic device according to the present invention.

Next, the substrate 301 with an aluminum thin film was set on a substrate holder 701 of a DC magnetron sputtering system 700 shown in FIG. 3, followed by evacuation down to a pressure of $10^{-3}$ Pa or lower.

The substrate holder 701 was electrically insulated to thereby keep a sample in a floating state. Thereafter, an argon gas and an oxygen gas were supplied from a gas introducing means 702 at a flow rate of 30 sccm and 15 sccm, respectively while keeping the pressure at $2 \times 10^{-1}$ Pa. Subsequently, the substrate 301 was heated by a heater 703 up to 300° C. (substrate temperature). Then, a DC power of 700W was applied from a DC sputtering power source 705 to a zinc oxide (ZnO) target 704 having a diameter of 6 inches Φ for 22 minutes and 30 seconds for sputter deposition of a zinc oxide (ZnO) reflection increasing film having a thickness of about 3000 nm. Thus, a light reflection layer 302 was formed on the substrate 301.

(Second Photovoltaic Device)

Figure 4:
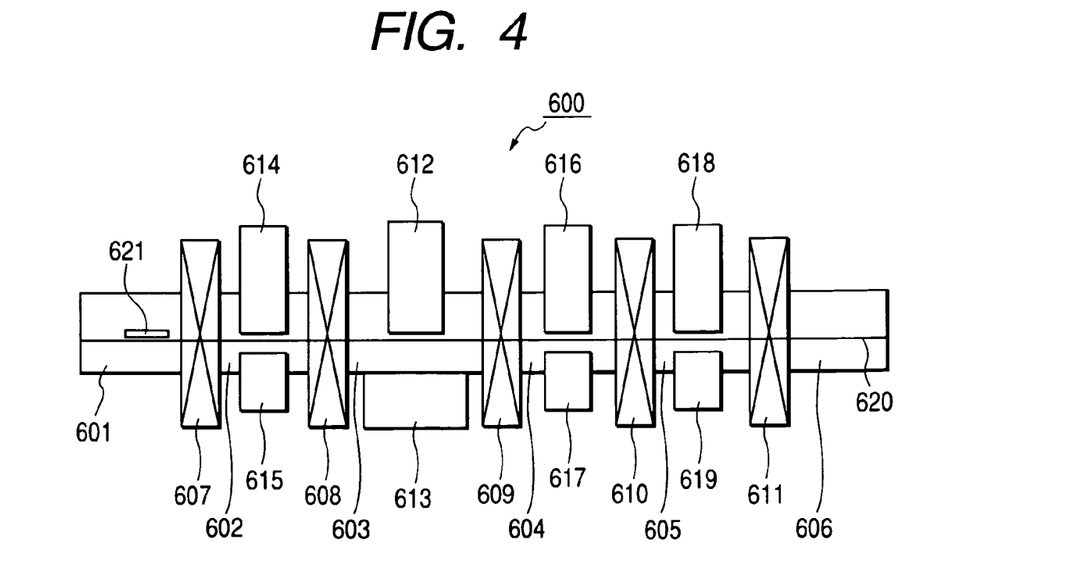
FIG. 4 is a schematic diagram showing an example of an apparatus suitable for forming a semiconductor layer of the stacked photovoltaic device according to the present invention.

FIG. 4 is a schematic view showing an example of a configuration of an apparatus suitable for forming a semiconductor layer of the stacked photovoltaic device of the present invention. In FIG. 4, a deposited film forming apparatus 600 is mainly constituted of a loading chamber 601, an n-type layer RF chamber 602, a microcrystalline silicon i-type layer chamber 603, an amorphous silicon i-type layer RF chamber 604, a p-type layer RF chamber 605, and an unload chamber 606. The chambers are isolated from each other by gate valves 607, 608, 609, 610, and 611 so that material gases are not mixed with each other.

The microcrystalline silicon i-type layer chamber 603 is constituted of a heater 612 for heating a substrate and a plasma CVD chamber 613. The RF chamber 602 has a heater 614 for n-type layer deposition and a deposition chamber 615 for n-type layer deposition; the RF chamber 604 has a heater 616 for i-type layer deposition and a deposition chamber 617 for i-type layer deposition; and the RF chamber 605 has a heater 618 for p-type layer deposition and a deposition chamber 619 for p-type layer deposition. The substrate was set to a substrate holder 621 and moved on a rail 620 by externally driven rollers. In the plasma CVD chamber 613 is deposited a microcrystalline film. VHF plasma CVD method is used for the deposition of the microcrystalline film.

Each of the semiconductor layers was formed under the conditions in table 1 using this type of deposited film forming apparatus.

TABLE 1

| | Film formation gas (sccm) | | | | Power density (W/cm$^2$) | | Pressure (pa) | Substrate temperature (° C.) | Film thickness (nm) |
|---|---|---|---|---|---|---|---|---|---|
| | SiH$_4$ | H$_2$ | PH$_3$ (2% H dilution) | BF$_3$ (2% H dilution) | RF | VHF | | | |
| First photovoltaic device | | | | | | | | | |
| N1 | 2 | 48 | 0.5 | | 0.04 | | 180 | 225 | 10 |
| i1 | 2 | 48 | | | 0.04 | | 150 | 210 | 480 |
| P1 | 0.025 | 35 | | 1 | 1.2 | | 270 | 165 | 5 |
| Second photovoltaic device | | | | | | | | | |
| N2 | 2 | 48 | 0.5 | | 0.04 | | 180 | 225 | 20 |
| i2 | 25 | 750 | | | | 0.2 | 40 | 250 | 2000 |
| P2 | 0.025 | 35 | | 1 | 1.2 | | 270 | 165 | 5 |

First, the second photovoltaic device was formed on the substrate 301 by the following procedure in accordance with Table 1. The substrate 301 was set to the substrate holder 621, which was set on the rail 620 of the loading chamber 601. Then, the inside of the loading chamber 601 was exhausted to a vacuum of several hundreds of mPa or lower.

Next, the gate valve 607 was opened and the substrate holder 621 was moved to the n-type layer deposition chamber 615 of the chamber 602. In a state that the gate valves 607, 608, 609, 610, and 611 were closed, an n-type layer was deposited in the predetermined film thickness using the predetermined material gases. Then, after sufficiently exhausting the chamber 602, the gate valve 608 was opened, the substrate holder 621 was moved to the deposition chamber 603, and the gate valve 608 was closed.

The substrate was heated to the predetermined substrate temperature by the heater 612, the predetermined material gases were introduced at the predetermined flow rates, the predetermined VHF energy was introduced into the deposition chamber 613 at a predetermined vacuum degree to generate a plasma, thereby depositing a microcrystalline silicon i-type layer on the substrate in the predetermined thickness. After the chamber 603 was sufficiently exhausted, the gate valves 609 and 610 were opened and the substrate holder 621 was moved from the chamber 603 to the chamber 605.

After the substrate holder 621 was moved to the p-type layer deposition chamber 619 of the chamber 605, the substrate was heated to the predetermined temperature with the heater 618. The material gases for p-type layer deposition were supplied to the deposition chamber 619 at the predetermined flow rates and RF energy was introduced into the deposition chamber 619 while keeping a predetermined vacuum degree to deposit a p-type layer in the predetermined thickness.

After the deposition chamber 619 was sufficiently exhausted following the above described procedure, the gate valve 611 was opened and the substrate holder 621 with the substrate 301 having the semiconductor layers deposited thereon was moved to the unload chamber 606.

Next, after all the gate valves were closed, nitrogen gas was introduced into the unload chamber 606 in a sealed state to lower the substrate temperature. Thereafter, a take-out valve of the unload chamber 606 was opened and the substrate holder 621 was taken out.

(Selective Reflection Layer)

Next, the half-completed substrate 301 (up to the formation of the second photovoltaic device) was detached from the substrate holder 621 and set on the substrate holder 701 of the DC magnetron sputtering system 700 shown in FIG. 3 for forming the selective reflection layer, followed by the evacuation down to the pressure of $10^{-3}$ Pa or lower. The substrate holder 701 was electrically insulated to thereby keep the photovoltaic device as a sample in a floating state. Thereafter, an argon gas and an oxygen gas were supplied from the gas introducing means 702 at a flow rate of 30 sccm and 0.2 to 30 sccm, respectively, with reference to Table 2 while keeping the pressure at $2 \times 10^{-1}$ Pa. Subsequently, the substrate 301 was heated by the heater 703 up to 150° C. (substrate temperature). Then, a DC power of 650W was applied from the DC sputtering power source 705 to the zinc oxide (ZnO) target 704 having a diameter of 6 inches Φ for sputter deposition of a zinc oxide (ZnO) selective reflection layer having a film thickness of about 800 nm. Upon sputtering, sputtering time was controlled to obtain uniform film thickness among the samples. In this case, at the same time, a stainless steel (SUS 430) substrate and a quartz substrate measuring 45 mm×45 mm were set on the substrate holder 701. A similar zinc oxide (ZnO) film was formed thereon through the deposition to prepare a sample for the electric characteristic measurement.

TABLE 2

| Sample No. | Oxygen flow rate (sccm) |
|---|---|
| A | 0.2 |
| B | 0.4 |
| C | 0.7 |
| D | 1.0 |
| E | 2.0 |
| F | 4.0 |
| G | 7.0 |
| H | 11.0 |
| I | 16.0 |
| J | 30.0 |

(First Photovoltaic Device)

Next, a pin-type amorphous Si:H photovoltaic device as the first photovoltaic device was prepared on the substrate 301 on which the selective reflection layer had been formed, under the conditions listed in Table 1 by using the deposited film forming apparatus 600 of FIG. 4 again. The procedure is as follows.

That is, as in the above case, the n-type layer was formed through the deposition with a given thickness under the given conditions. The chamber 602 was well evacuated, after which the gate valves 608 and 609 were opened to transfer the substrate holder 621 to the deposition chamber 604 and then the gate valves 608 and 609 were closed.

The substrate 301 was heated to a given substrate temperature by the heater 616. A given material gas was introduced at a required amount to attain a given degree of vacuum and apply given RF energy to the deposition chamber 617 to thereby generate plasma. The amorphous Si:H i-type layer was formed through the deposition on the substrate with a given thickness with reference to Table 1 while adjusting a film formation time. The chamber 604 was well evacuated and the gate valve 610 was opened to transfer the substrate holder 621 from the chamber 604 to the chamber 605.

Similar to the above, the p-type layer was formed thorough the deposition with a given thickness under the given conditions.

In the same way as in the above case, the deposition chamber 619 was well evacuated. After that, the gate valve 611 was opened to transfer the substrate holder 621 to the unload chamber 606. On the substrate holder 621, the substrate 301 having the semiconductor layer formed thereon through the deposition had been set. As in the above case, the substrate holder 621 was taken out of the unload chamber 606.

(Transparent Electrode)

Then, the substrate 301 was attached to the surface of the anode of the DC magnetron sputtering system (not shown), the peripheral portion of the substrate was shielded with a stainless steel mask, and a target constituted of 10 wt % of tin oxide and 90 wt % of indium oxide was used to effect sputtering of indium-tin oxide as the transparent electrode in a central region of 40 mm square of the substrate.

The deposition conditions were the substrate temperature of 170° C., the flow rate of argon as an inert gas of 50 sccm, the flow rate of oxygen gas of 0.5 sccm, the pressure inside the deposition chamber of 300 mPa, the input electric power per unit area of the target of 0.2 W/cm². The deposition was carried out such that the deposited film thickness became 70 nm for about 100 seconds. The film thickness was adjusted to a predetermined value by previously checking the relation between a deposited film thickness and a deposition time under the same conditions as described above and depositing the film based on the relation.

(Passivation)

After that, the substrate 301 was put in a tank of an electrolyte of an $AlCl_3$ aqueous solution (not shown) for shunt passivation. With the substrate 301 side set as a negative electrode and an opposing electrode set as a positive electrode, a positive voltage of 3.5 V was intermittently applied six times for 1 second each for electrolyzation. The conditions therefor were as follows. An $AlCl_3$ aqueous solution had an electric conductivity of 68 mS/cm (25° C.) and the opposing electrode area was comparable to a sample area. After that, the sample was taken out of the electrolyte tank. The electrolyte solution left on the sample surface was sufficiently washed out with pure water, followed by drying the sample with a hot-air oven at 150° C. for 30 minutes.

Comparative Example

In this comparative example, a stacked photovoltaic device was produced with exactly the same structure and procedure as in the above example except for omitting the selective reflection layer between the first photovoltaic device and the second photovoltaic device.

Figure 7:
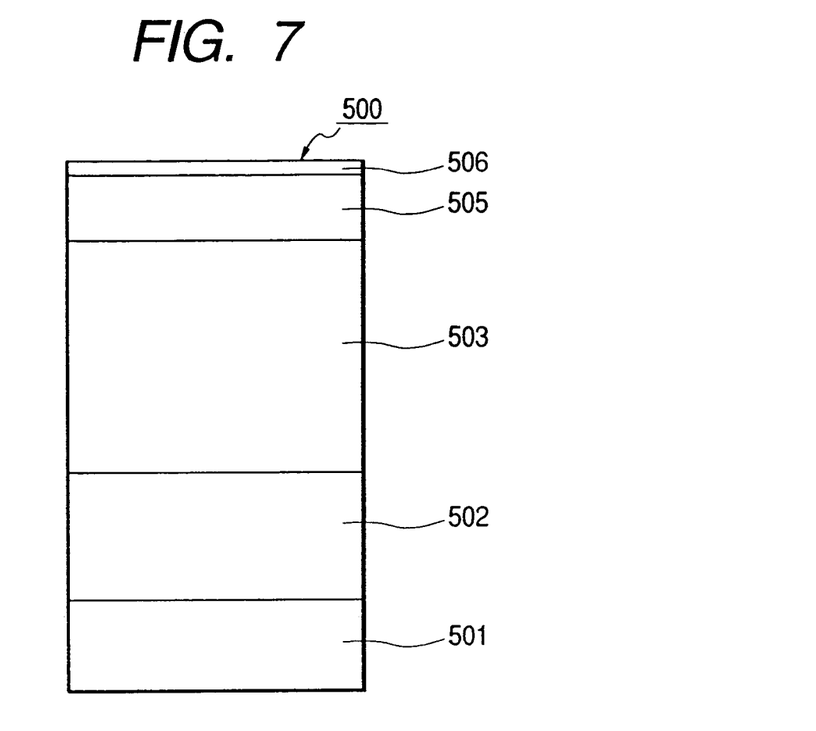
FIG. 7 is a diagram schematically showing a sectional structure of a stacked photovoltaic device having the same structure as the stacked photovoltaic device according the present invention except for omitting the selective reflection layer.

FIG. 7 is a diagram schematically showing a cross-sectional structure of the stacked photovoltaic device having the same structure as in the stacked photovoltaic device according to the present invention except for omitting the selective reflection layer. In FIG. 7, a stacked photovoltaic device 500 is formed by stacking on a conductive substrate 501 made of metal etc., a light reflection layer 502, a second photovoltaic device 503, a first photovoltaic device 505, and a transparent electrode 506 in the stated order.

Reference Example

As a reference example, a stacked photovoltaic device was produced with all the same structure and procedure as in the above example except for depositing zinc oxide (ZnO) into a film having a thickness of about 800 nm as the selective reflection layer between the first photovoltaic device and the second photovoltaic device in the following manner. That is, the commercially available DC magnetron sputtering system (not shown) used for forming the aluminum thin film for the light reflection layer 302 in the above example was adopted. The target was changed to a zinc oxide (ZnO) target. Then, an argon gas and an oxygen gas were supplied at a flow rate of 30 sccm and 13 sccm, respectively, the pressure was set at $2\times10^{-1}$ Pa, the substrate temperature was set at 150° C., and a DC power of 500W was applied for 8 minutes.

In this case, at the same time, a stainless steel (SUS 430) substrate and a quartz substrate measuring 45 mm×45 mm were set on a substrate holder (not shown) as in the example. A similar zinc oxide (ZnO) film was formed thereon through the deposition to prepare a sample for the electric characteristic measurement.

(Measurement)

Figure 5:
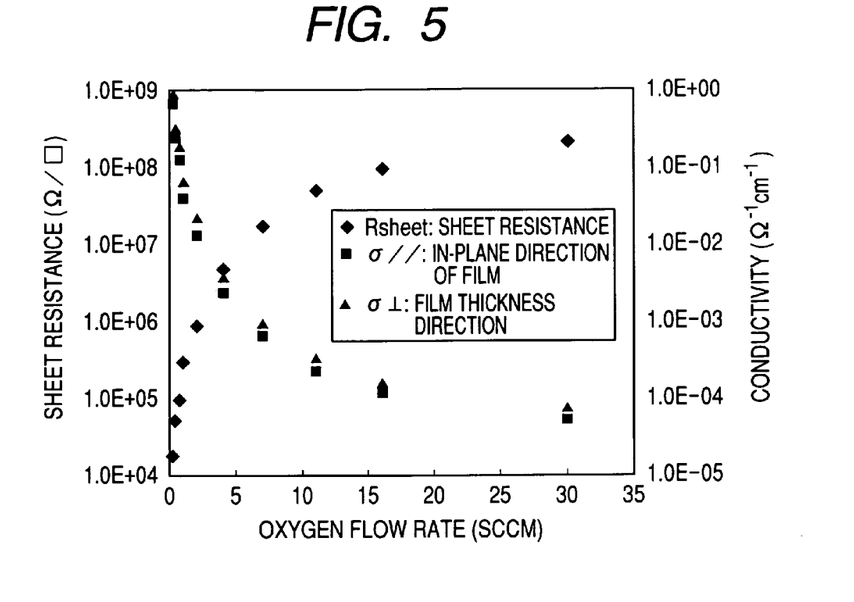
FIG. 5 is a graph representative of a relationship among a sheet resistance R ($\Omega$/□) of a selective reflection layer, a conductivity $\sigma_{//}$ ($\Omega^{-1}$ cm$^{-1}$) in an in-plane direction of a film thereof, a conductivity $\sigma_{\perp}$ ($\Omega^{-1}$ cm$^{-1}$) in a thickness direction of a film thereof, and an oxygen flow rate.

First, the electric characteristics of the zinc oxide (ZnO) film constituting the selective reflection layer were measured. The zinc oxide (ZnO) film used in the present invention exhibits a comparatively high sheet resistance value. Even with the sample exhibiting the small value, the resistance value on the order of $k\Omega$ can be measured. Therefore, a four-terminal probe sheet resistance measuring device generally adopted for the sheet resistance measurement was not used; instead, the resistance value was determined from volt-ampere characteristic while providing gap electrodes to the sample. First, the gap electrodes were formed to the sample on the quartz substrate at an interval of 250 μm with a channel width of 5 cm by depositing Cr into a film with a thickness of 2 μm through vacuum evaporation. The volt-ampere characteristic were measured using "4140B pA Meter/Dc Voltage Source" (source measurement unit) (available from Hewlett Packard Co., Ltd.) while applying a voltage between the gap electrodes to measure a current value. From the measurements, a sheet resistance R ($\Omega/\square$) was obtained and a conductivity $\sigma_{//}$ ($\Omega^{-1}$ cm$^{-1}$) in an in-plane direction of the film was calculated from the obtained sheet resistance. FIG. 5 is a graph representative of a relationship between the sheet resistance R and the conductivity Q, and an oxygen flow rate.

Next, for measuring a conductivity $\sigma_\perp$ ($\Omega^{-1}$ cm$^{-1}$) in the film thickness direction, a circular electrode with a surface area of 0.268 cm² was formed on the sample on the stainless steel (SUS 430) substrate by depositing Cr into a film with a thickness of 2 μm through vacuum evaporation as in the above case. A constant current of 1 to 100 mA was caused to flow between the stainless steel substrate of the sample and the circular electrode thereon from a DC power source "R6145" (available from ADVANTEST CORPORATION) and the voltage between the two electrodes was measured by DMM "34401A digital multimeter" (available from Hewlett Packard Co., Ltd.). Further, an additional DMM "34401A digital multimeter" (available from Hewlett Packard Co., Ltd.) was used to monitor the current for obtaining an accurate current value as well. The conductivity $\sigma_{\perp}$ ($\Omega^{-1}$ cm$^{-1}$) in the film thickness direction was calculated based on the volt-ampere characteristic thus obtained. In the graph of FIG. 5, a relationship between the conductivity $\sigma_{\perp}$ ($\Omega^{-1}$ cm$^{-1}$) in the film thickness direction and the oxygen flow rate is shown together with the aforementioned relationship.

Concurrently, the conductivity $\sigma_{//}$ in the in-plane direction and the conductivity $\sigma_\perp$ in the film thickness direction of the zinc oxide (ZnO) thin film sample for the selective reflection layer formed in the reference example were measured. As a result, $\sigma_{//}=2.55\times10^{-4}$ ($\Omega^{-1}$ cm$^{-1}$) and $\sigma_\perp=2.48\times10^{-4}$ ($\Omega^{-1}$ cm$^{-1}$). As apparent from the results, there was almost no difference between the conductivity in the in-plane direction and the conductivity in the film thickness direction.

Next, the stacked photovoltaic devices prepared in the example and the comparative example were each measured for the volt-ampere characteristic using a solar simulator "YSS-150" (available from Yamashita Denso Corporation) in a state of being irradiated with simulated sunlight of a spectrum of AM 1.5 and a light intensity of 100 mW/cm². Based on the measured volt-ampere characteristic, a short-circuit current density (Jsc (mA/cm²)), an open-circuit voltage (Voc (V)), a fill factor (FF), and a conversion efficiency (η (%)) were obtained.

Figure 6:
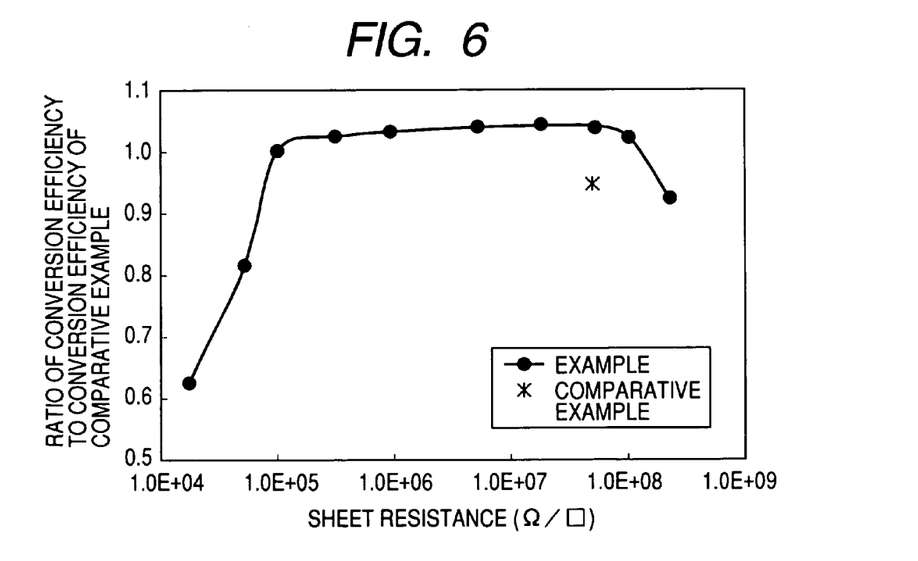
FIG. 6 is a graph representative of a sheet resistance R ($\Omega$/□) of a selective reflection layer and a ratio of a conversion efficiency to a conversion efficiency of a comparative example.

Table 3 shows those characteristic values in a manner of organizing the values on a sample basis in a ratio of the sample of the example to the sample of the comparative example, which has no selective reflection layer (example/comparative example). In Table 3, the sheet resistance ($\Omega/\square$) of the selective reflection layer is shown together with the sample name in the column of "SampleName". FIG. 6 is a graph showing a relationship between the sheet resistance and a ratio of the conversion efficiency η to that of the comparative example.

When the sheet resistance of the selective reflection layer is below 100 kΩ/□, a shunt current of the cell increases, resulting in large reduction in FF. Thus, the reduction cancels out a current increment achieved by incorporating the selective reflection layer. As a result, the conversion efficiency is lower than that of the device with no selective reflection layer instead of exceeding this.

When the sheet resistance is higher than 100 kΩ/□, the current increment due to the selective reflection layer takes effect, thereby enhancing the conversion efficiency. In the case where the sheet resistance reaches 5 MΩ/□ to 50 MΩ/□, the shunt current does not give influence thereon at all, making it possible to considerably increase the conversion efficiency. The satisfactory characteristics can be achieved with the sheet resistance increased up to about 100 MΩ/□. However, with the sheet resistance increased to about 200 MΩ/□, a power loss is large owing to a series resistance of the selective reflection layer. As a result, the conversion efficiency is lower than that in the case of not incorporating the selective reflection layer.

The graph of FIG. 6 reveals that Samples D to I according to the present invention are free of reduction in FF and Voc, so that an increase in Jsc due to the selective reflection layer leads to a high conversion efficiency, which is originally aimed at.

Also, the sample of the reference example, in which the conductivity in the in-plane direction equals the conductivity in the film thickness direction of the selective reflection layer, involves reduction in FF as may result from the series resistance and fails to obtain a high conversion efficiency, as compared with Sample H according to the present invention with almost the same sheet resistance value as that of the sample concerned.

TABLE 3

| Sample name (Ω/□) | Jsc | FF | Voc | Eff. |
|---|---|---|---|---|
| Comparative Example | 1.000 | 1.000 | 1.000 | 1.000 |
| A  ($1.81 \times 10^4$) | 1.048 | 0.640 | 0.929 | 0.624 |
| B  ($5.20 \times 10^4$) | 1.055 | 0.808 | 0.957 | 0.816 |
| C  ($9.85 \times 10^4$) | 1.058 | 0.962 | 0.986 | 1.003 |
| D  ($3.06 \times 10^5$) | 1.055 | 0.983 | 0.990 | 1.027 |
| E  ($9.09 \times 10^5$) | 1.057 | 0.983 | 0.989 | 1.028 |
| F  ($5.01 \times 10^6$) | 1.054 | 0.997 | 0.992 | 1.043 |
| G  ($1.78 \times 10^7$) | 1.059 | 0.994 | 0.994 | 1.047 |
| H  ($5.16 \times 10^7$) | 1.058 | 0.996 | 0.989 | 1.043 |
| I  ($1.08 \times 10^8$) | 1.054 | 0.982 | 0.991 | 1.026 |
| J  ($2.24 \times 10^8$) | 1.055 | 0.899 | 0.979 | 0.997 |
| Reference Example ($4.90 \times 10^7$) | 1.056 | 0.913 | 0.986 | 0.950 |

What is claimed is:

1. A stacked photovoltaic device comprising:
   at least one pair of a first photovoltaic device and a second photovoltaic device stacked in order from a light incident side; and
   a selective reflection layer formed between the at least one pair of the first photovoltaic device and the second photovoltaic device and adapted to electrically connect therebetween,
   wherein the selective reflection layer has a sheet resistance of 100 kΩ/□ or more and 100 MΩ/□ or less.

2. The stacked photovoltaic device according to claim 1, wherein the selective reflection layer has a sheet resistance of 100 kΩ/□ or more 50 MΩ/□ or less.

3. The stacked photovoltaic device according to claim 1, wherein the selective reflection layer has a sheet resistance of 5 MΩ/□ or more and 50 MΩ/□ or less.

4. The stacked photovoltaic device according to claim 1, wherein the selective reflection layer has a conductivity in a thickness direction of a film which is larger than a conductivity in an in-plane direction of the film.

5. The stacked photovoltaic device according to claim 1, wherein the selective reflection layer comprises a deposited film formed of metal oxide.

6. The stacked photovoltaic device according to claim 1, wherein the first photovoltaic device has at least a pin-type junction and an i-type layer thereof comprises amorphous Si:H.

7. The stacked photovoltaic device according to claim 1, wherein the second photovoltaic device has at least a pin-type junction and an i-type layer thereof comprises Si having crystallinity.

8. The stacked photovoltaic device according to claim 1, wherein the second photovoltaic device has at least a pn-type junction and a p-type semiconductor and an n-type semiconductor comprise one of monocrystalline Si, polycrystalline Si, and Si having crystallinity.

* * * * *

UNITED STATES PATENT AND TRADEMARK OFFICE
CERTIFICATE OF CORRECTION

PATENT NO. : 7,189,917 B2
APPLICATION NO. : 10/801681
DATED : March 13, 2007
INVENTOR(S) : Okada et al.

It is certified that error appears in the above-identified patent and that said Letters Patent is hereby corrected as shown below:

COVER PAGE, ITEM (56):
Foreign Patent Documents, "JP  63-77167 A  *  4/1966" should be deleted.

COLUMN 1:
Line 55, "disclose" should read -- discloses --.

COLUMN 2:
Line 39, "planer" should read -- planar --;
Line 49, "planer" should read -- planar --;
Line 60, "planer" should read -- planar --; and
Line 66, "planer" should read -- planar --.

COLUMN 4:
Line 18, "according" should read -- according to --.

COLUMN 5:
Line 29, "Particular," should read -- particular, --.

COLUMN 12:
Line 13, "characteristic" should read -- characteristics --;
Line 37, "$(\Omega^{-1}$" should read -- $(\Omega^{-1}$ --; and
Line 40, "$(\Omega^{-1}$" should read -- $(\Omega^{-1}$ --.

UNITED STATES PATENT AND TRADEMARK OFFICE
CERTIFICATE OF CORRECTION

PATENT NO. : 7,189,917 B2
APPLICATION NO. : 10/801681
DATED : March 13, 2007
INVENTOR(S) : Okada et al.

It is certified that error appears in the above-identified patent and that said Letters Patent is hereby corrected as shown below:

COLUMN 14:
Line 23, "more 50" should read -- more and 50 --.

Signed and Sealed this

Fourth Day of March, 2008

JON W. DUDAS
*Director of the United States Patent and Trademark Office*